(12) United States Patent
Lieberman et al.

(10) Patent No.: US 10,986,294 B2
(45) Date of Patent: *Apr. 20, 2021

(54) WIDE FIELD OF VIEW OPTICAL MODULE FOR LINEAR SENSOR

(71) Applicant: Six Degrees Space Ltd, Jerusalem (IL)

(72) Inventors: Klonymus Sholom Lieberman, Jerusalem (IL); Daniel Greenspan, Jerusalem (IL)

(73) Assignee: Six Degrees Space Ltd, Jerusalem (IL)

(*) Notice: Subject to any disclaimer, the term of this patent is extended or adjusted under 35 U.S.C. 154(b) by 0 days.

This patent is subject to a terminal disclaimer.

(21) Appl. No.: 16/583,304

(22) Filed: Sep. 26, 2019

(65) Prior Publication Data
US 2020/0041786 A1 Feb. 6, 2020

Related U.S. Application Data

(63) Continuation of application No. 15/782,504, filed on Oct. 12, 2017, now Pat. No. 10,511,794.
(Continued)

(51) Int. Cl.
*G02B 27/00* (2006.01)
*G02B 3/04* (2006.01)
(Continued)

(52) U.S. Cl.
CPC ............. *H04N 5/3692* (2013.01); *G02B 3/02* (2013.01); *G02B 3/04* (2013.01); *G02B 3/06* (2013.01);
(Continued)

(58) Field of Classification Search
CPC ...... H04N 5/3692; H04N 5/369; H04N 5/355; H04N 1/03; H04N 1/031; H04N 1/0311; H04N 1/0318; H04N 1/193; H04N 1/1935; H04N 3/1581; H01L 27/14625; H01L 27/14627; H01L 27/14601; H01L 27/146; G02B 3/02; G02B 3/04; G02B 3/06;
(Continued)

(56) References Cited

U.S. PATENT DOCUMENTS 4,516,018 A 5/1985 Bodenheimer
4,973,156 A 11/1990 Dainis
(Continued)

OTHER PUBLICATIONS

International Search Report for corresponding PCT application PCT/IB2017/056330 dated Feb. 12, 2018.
(Continued)

*Primary Examiner* — John R Lee
(74) *Attorney, Agent, or Firm* — Heidi Brun Associates Ltd.

(57) ABSTRACT

A sensing module includes a linear image sensor and an optical unit. The unit includes an optical element having a curved, outward surface and a covering on the outward surface. The covering has a slit formed therein. The optical unit faces the sensor with the slit perpendicular to a longitudinal axis of the sensor and images a wide field of view onto a single pixel of the linear sensor, wherein light impinging normal to the slit, at any location along the slit, is imaged on a central pixel of the sensor while light impinging one of a plurality of non-normal angles to the slit is imaged on an associated one of a plurality of non-central pixels of the sensor.

6 Claims, 7 Drawing Sheets

Related U.S. Application Data

(60) Provisional application No. 62/446,937, filed on Jan. 17, 2017, provisional application No. 62/525,218, filed on Jun. 27, 2017.

(51) Int. Cl.
| | |
|---|---|
| *G02B 3/06* | (2006.01) |
| *H04N 5/369* | (2011.01) |
| *H01L 27/146* | (2006.01) |
| *G02B 3/02* | (2006.01) |
| *G06T 7/246* | (2017.01) |

(52) U.S. Cl.
CPC .... *G02B 27/0081* (2013.01); *H01L 27/14625* (2013.01); *G06T 7/246* (2017.01)

(58) Field of Classification Search
CPC .. G02B 3/0056; G02B 3/0062; G02B 3/0031; G02B 21/361; G02B 21/0032; G02B 21/362; G02B 27/646; G02B 27/0081; G06T 7/246; G06T 7/70; G06T 7/80; G01S 3/783; G03G 15/041; G03G 15/0435; G01N 21/956; G01N 2021/8822; B29D 11/00278
See application file for complete search history.

(56) References Cited

U.S. PATENT DOCUMENTS

| | | | |
|---|---|---|---|
| 5,814,803 A | | 9/1998 | Olmstead |
| 5,914,483 A | * | 6/1999 | Fallon .................... B64G 1/281 |
| | | | 244/3.16 |
| 6,073,851 A | * | 6/2000 | Olmstead ........... G06K 7/10702 |
| | | | 235/454 |
| 6,324,296 B1 | | 11/2001 | McSheery |
| 6,710,767 B1 | | 3/2004 | Hasegawa |
| 6,801,375 B2 | | 10/2004 | Hayashide |
| 10,511,794 B2 | * | 12/2019 | Lieberman ........... H04N 5/3692 |
| 2003/0083844 A1 | | 5/2003 | Reddi |
| 2008/0266893 A1 | | 10/2008 | Speier |
| 2009/0033623 A1 | | 2/2009 | Lin |
| 2009/0103088 A1 | | 4/2009 | Delmas |
| 2009/0272807 A1 | | 11/2009 | Vinogradov |
| 2010/0051696 A1 | | 3/2010 | Liu |
| 2011/0043806 A1 | | 2/2011 | Guetta |
| 2012/0267541 A1 | | 10/2012 | Utukuri |
| 2018/0205899 A1 | | 7/2018 | Lieberman |
| 2020/0041786 A1 | * | 2/2020 | Lieberman ............... G02B 3/06 |

OTHER PUBLICATIONS

Liu, Haiqing et al, "Precise calibration of linear camera equipped with cylindrical lenses using a radial basis function-based mapping technique", Optics Express 23(3):3412 • Feb. 4, 2015.
Pedersen et al. "Linear Two-Axix MOEMS Sun Sensor", M.Sc. Thesis, Technical University of Denmark (DTU), p. 14-15, Aug. 24, 2004 [retrieved on Jan. 23, 2018]. Retrieved from the Internet: <URL: http://citeseerx.ist.psu.edu/viewdoc/download?doi=10.1.1.719.7460&rep=rep1&type=pdf>.

* cited by examiner

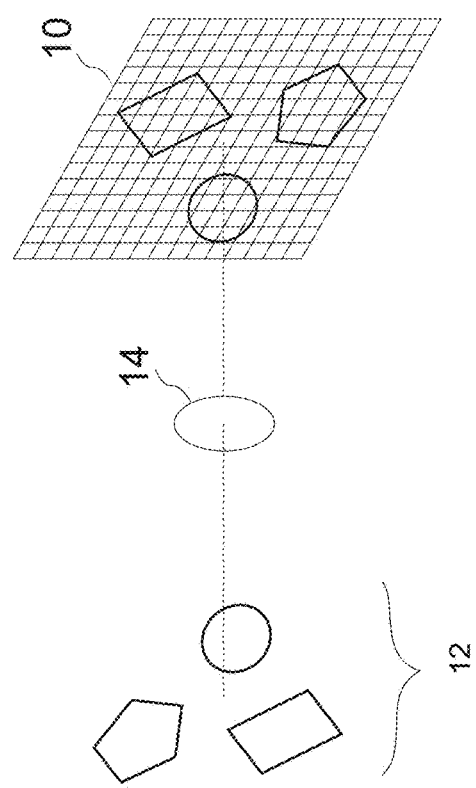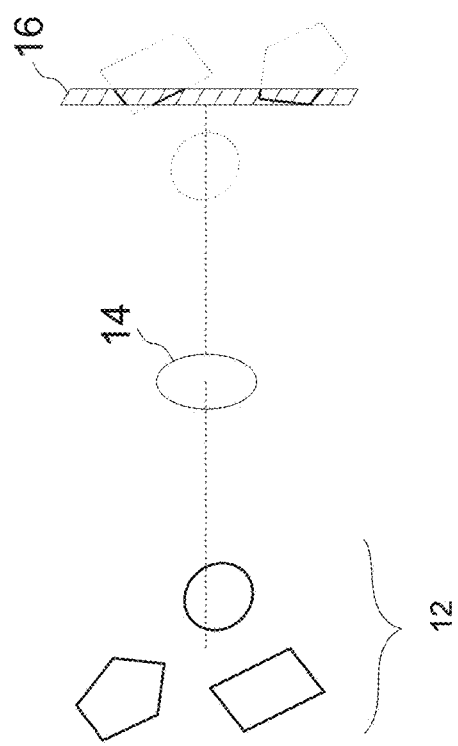

WIDE FIELD OF VIEW OPTICAL MODULE FOR LINEAR SENSOR

CROSS REFERENCE TO RELATED APPLICATIONS

This application is a continuation application from U.S. patent application Ser. No. 15/782,504 filed Oct. 12, 2017, which application claims priority from U.S. provisional patent applications 62/446,937, filed Jan. 17, 2017, and 62/525,218, filed Jun. 27, 2017, all of which are incorporated herein by reference.

FIELD OF THE INVENTION

The present invention relates to optical lenses generally and to optical lenses for linear imaging in particular.

BACKGROUND OF THE INVENTION

As can be seen in FIG. 1A, to which reference is now made, a two-dimensional image sensor 10 captures a two-dimensional scene 12. Linear image sensors, on the other hand, provide a single line of sensors. They require significantly less bandwidth and computation than 2D image sensors. However, as shown in FIG. 1B to which reference is now made, a linear sensor 16 only views a portion (e.g. one line) of scene 12.

To utilize any kind of image sensor, whether 2D sensor 10 or linear sensor 16, focusing units 14 formed of lenses of various kinds, are usually placed in front of the sensors to focus light onto the sensors.

Reference is now made to FIG. 2, which illustrates a prior art measuring system used in a motion tracking system discussed in U.S. Pat. No. 6,324,296, entitled "BI-DISTRIBUTED-PROCESSING MOTION TRACKING SYSTEM FOR TRACKING INDIVIDUALLY MODULATED LIGHT". The system of U.S. Pat. No. 6,324,296 has a linear sensor 16 and a cylindrical lens 20. As can be seen, linear sensor 16 is placed perpendicularly to cylindrical lens 20. Cylindrical lens 20 gathers light from a point P1 and provides it to sensor 16. The sensor of FIG. 2 is fixed in space and views a scene in which objects to be tracked move around.

SUMMARY OF THE PRESENT INVENTION

There is therefore provided, in accordance with a preferred embodiment of the present invention, a sensing module including a linear image sensor and an optical unit. The optical unit includes an optical element having a curved, outward surface and a covering on the curved surface. The covering has a slit formed therein. The optical unit faces the sensor with the slit perpendicular to a longitudinal axis of the linear sensor and images a wide field of view onto a single pixel of the linear sensor. Light impinging normal to the slit, at any location along the slit, is imaged on a central pixel of the linear sensor while light impinging one of a plurality of non-normal angles to the slit at any location along the slit, is imaged on an associated one of a plurality of non-central pixels of the linear sensor. The optical unit is rotationally invariant around the longitudinal axis of the linear sensor.

Moreover, in accordance with a preferred embodiment of the present invention, the optical element is a single monolithic lens.

Alternatively, in accordance with a preferred embodiment of the present invention, the optical element is a domed lens and the covering covers the outer surface of the domed lens.

Further, in accordance with a preferred embodiment of the present invention, the optical element is an aspheric toroidal lens mounted in an opaque dome and the covering is on the lens.

Still further, in accordance with a preferred embodiment of the present invention, the aspheric toroidal lens linearizes the pixel vs. angle of incidence response of the optical module.

Moreover, in accordance with a preferred embodiment of the present invention, the optical element is an oval-shaped dome.

There is also provided, in accordance with a preferred embodiment of the present invention, a sensing module including a linear image sensor and an optical unit. The optical unit includes an optical element having a curved surface and a covering on a flat outward surface of the optical element. The covering has a slit formed therein. The optical unit faces the sensor with the slit perpendicular to a longitudinal axis of the linear sensor and images a wide field of view onto a single pixel of the linear sensor. Light impinging normal to the slit, at any location along the slit, is imaged on a single central pixel of the linear sensor while light impinging at one of a plurality of non-normal angles to the slit at any location along the slit, is imaged on an associated one of a plurality of non-central pixels of the linear sensor. The optical element is a freeform lens including an aspheric optical surface with variable optical power located on an inward surface of the lens facing the sensor. The surface focuses light incident on the slit at each vertical elevation angle across a linear sensor and the optical power of the lens varies to maintain a constant magnification.

Moreover, in accordance with a preferred embodiment of the present invention, the optical element is a single monolithic lens.

Further, in accordance with a preferred embodiment of the present invention, a magnification of the optical element is varied to map a plurality of vertical lines to each one of the pixels of the linear sensor with minimal distortion.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 1A is a schematic illustration of a prior art, two-dimensional sensor viewing a scene;

FIG. 1B is a schematic illustration of a prior art, linear sensor viewing a scene;

Figure 2:
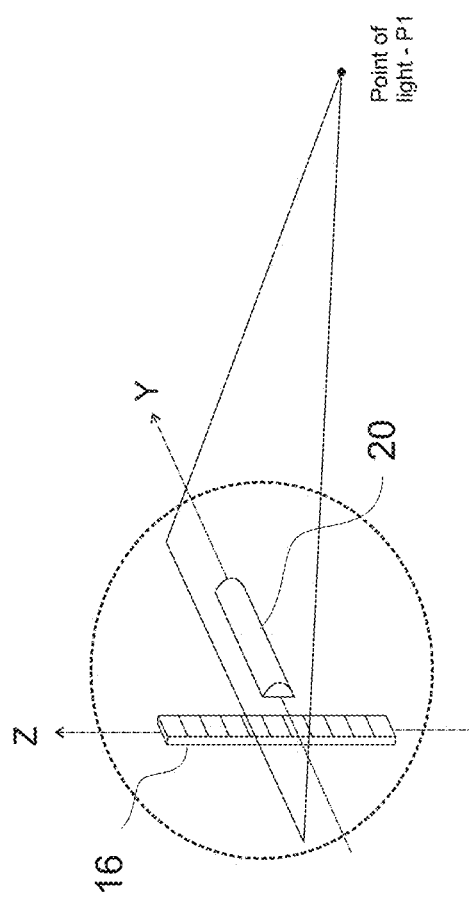
FIG. 2 is a schematic illustration of a prior art, linear sensor with a cylindrical lens.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Applicant has realized that, for tracking applications where the tracking unit moves around with the object whose position is being tracked, whether as part of a virtual reality system or on a moving device (a mobile phone, a drone, a car, etc.), it is necessary to compress a two-dimensional scene with as few ill effects, such as distortion or rotation errors, as possible, in order to provide accurate and fast information about the angular location of the object being tracked.

Applicant has also realized that placing a slit onto an outer surface of an optical element of some kind, may provide the desired image compression with relatively few side effects.

A Domed Slit

Figure 3:
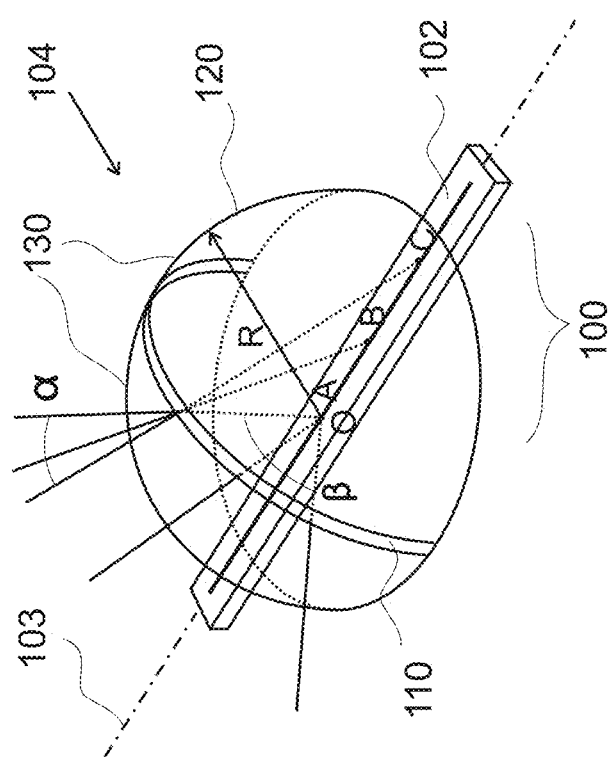
FIG. 3 is a schematic illustration of a linear sensor with a domed slit, constructed and operative in accordance with a preferred embodiment of the present invention.

Reference is now made to FIG. 3, which illustrates a sensing module 100 of the present invention. Sensing module 100 comprises a high speed, linear image sensor 102 and an optical element 104 comprising a curved, narrow slit 110 positioned over, or on, the curved outer surface of an optically clear, dome substrate 120.

Linear sensor 102 may be oriented perpendicularly to the direction of slit 110 and one point, such as the midpoint, of linear sensor 102 may be located at or near a center O of the radius of curvature of slit 110. Linear sensor 102 may be any suitable high speed, linear sensor, such as the ELIS-1024, commercially available from Dynamax Imaging of Canandaigua N.Y.

In a preferred embodiment, clear dome substrate 120 may be a glass or plastic half ball lens. Alternatively, substrate 120 may be hollowed out. In an alternative embodiment (not shown), optical substrate 120 may be a solid or hollowed out half cylinder with the slit oriented at the center of the curved section of the cylinder.

Slit 110 may be formed according to any suitable means. For the embodiment where substrate 120 is a dome, slit 110 may be formed by printing a covering for the curved surface of dome substrate 120. The covering may have two opaque regions 130 separated by a clear region forming slit 110 for light to pass through.

It will be appreciated that light can enter slit 110 at any azimuth angle α, parallel to sensor 102, and at any collection angle β along slit 110, perpendicular to sensor 102. From the principles of geometrical optics, it is evident that light entering slit 110 from a particular direction will illuminate a specific region of the sensor defined by azimuth angle α and a radius R of dome 120. For example, light coming from an angle normal to the outer surface of dome 120 will illuminate a region A of sensor 102 Similarly, light from any collection angle β (all of which are normal to the outer surface of dome 120) may reach sensor 102 at the same region A. However, light coming from non-normal angles α will reach other regions, such as regions B and C, of sensor 102.

In practice, the geometry of dome 120 may effectively integrate all of the light along each arc at angle α into a single data point along sensor 102. Applicant has realized that the angle of the optical collection is largely independent of the distance to the light source so optical element 104 may integrate light from light sources of any size room and may also track lights or the sun outdoors.

The angular resolution may be determined by the width of slit 110 and radius R between slit 110 and sensor 102, with larger slits collecting more light but providing lower resolution. The overall detection angle will be limited by radius R of dome 120 and of the size of sensor 102.

It may be appreciated that the width of slit 110 or the optical transmission, defined by the amount of optical transparency, may be varied along the length of the slit to normalize, otherwise compensate for, or enhance, any geometrical effects that may reduce the strength of the incident signal as the collection angle β increases.

A Toroidal Lens with Dome Slit

Figure 4:
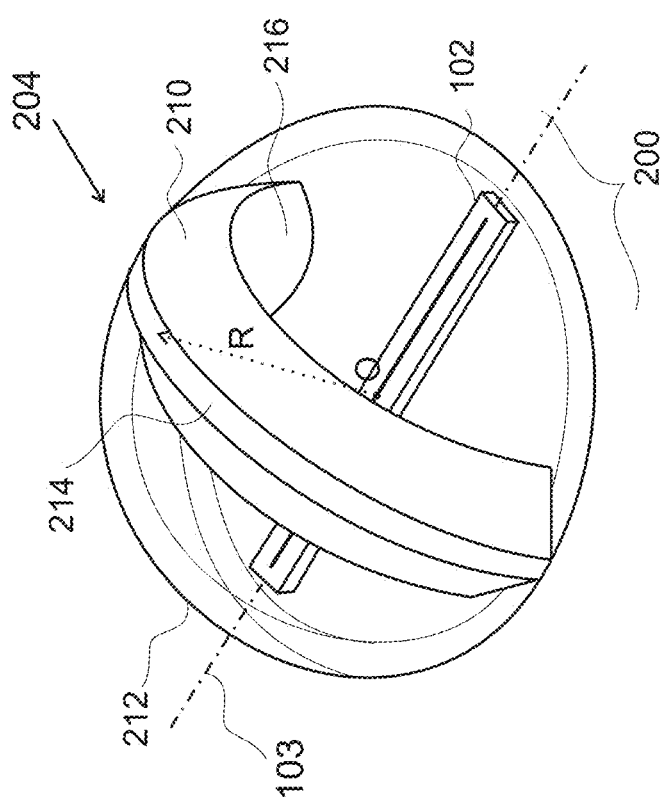
FIG. 4 is a schematic illustration of an alternative embodiment of the sensor of FIG. 3.

Reference is now made to FIG. 4, which shows an alternative, improved embodiment of the present invention in a perspective schematic view. In this embodiment, the sensing module is sensing module 200, comprising linear image sensor 102 and an optical element 204 comprising an aspheric toroidal lens 210. Lens 210 may be mounted in an opaque dome 212 with a slit 214 defining the aperture of lens 210. Lens element 210 may have a curved inner surface 216 which may act to focus the light arriving across slit 214 to a single point on sensor 102. This may combine the resolution of a narrow slit, such as slit 110 of FIG. 3, with the light collection efficiency of a wider slit. As in the previous embodiment, sensor 102 may be placed at or near center O of the radius of curvature of the slit aperture 214 of toroidal lens 210 and may be oriented generally perpendicular to slit 214.

It will be appreciated that the focusing power of inner surface 216 may be adjusted to ensure that each pixel of sensor 102 may respond similarly for all angles impinging upon it.

It will be appreciated that optical elements 104 and 204 may optically compress a two-dimensional scene to reduce the data bandwidth. It will also be appreciated that use of linear sensor 102 may reduce the computational requirements compared to conventional 2D or 3D image processing. Sensing modules 100 and 200 may be useful for identifying, locating and tracking bright light sources as well as high contrast vertical features in a scene and may be useful in the tracking system discussed in the application entitled, "Method and Apparatus for Indoor Positioning", being filed on the same day herewith, assigned to the common assignee of the present invention, and incorporated herein by reference.

In an alternative embodiment, the dome may be aspherical or oval-shaped, having one radius of curvature along the direction of the slit and a second radius of curvature along the axis of sensor 102. This may allow the slit to be located closer to sensor 102, reducing the overall height of the module, while still utilizing the entire length of the sensor and achieving sensing angles extending greater than 90 degrees.

It will be appreciated that in the embodiments of FIGS. 3 and 4, the position of light on sensor 102 from a particular azimuth angle α is generally invariant to the rotation of sensor module 100 or 200 around a main axis 103 of sensor 102. Thus, a user may rotate sensor module 100 or 200 and the light from a particular light source, like a light bulb, will always impinge on the same section of sensor 102. This invariance may be achieved since sensor 102 is located at the center O of the radius of curvature.

Improved Optical Element

Applicant has realized that, in order to identify and track vertical features in a scene, it is desirable to image all the points of a vertical feature onto a single pixel of the linear sensor. This is challenging to achieve in practice with low cost imaging optics, particularly when imaging over a very large field of view. Cylindrical lenses, which are commonly employed with linear sensors, suffer from image distortion and their focus is poorly corrected at large angles. The curved slits in the embodiments of FIGS. 3 and 4 also introduce distortion of vertical features as a result of their curvature.

However, a straight slit may provide a relatively, distortion free mapping. It will be appreciated that the optical resolution is directly proportional to the slit width and such a straight slit may not have the rotational invariance of the embodiments of FIGS. 3 and 4.

Figure 5:
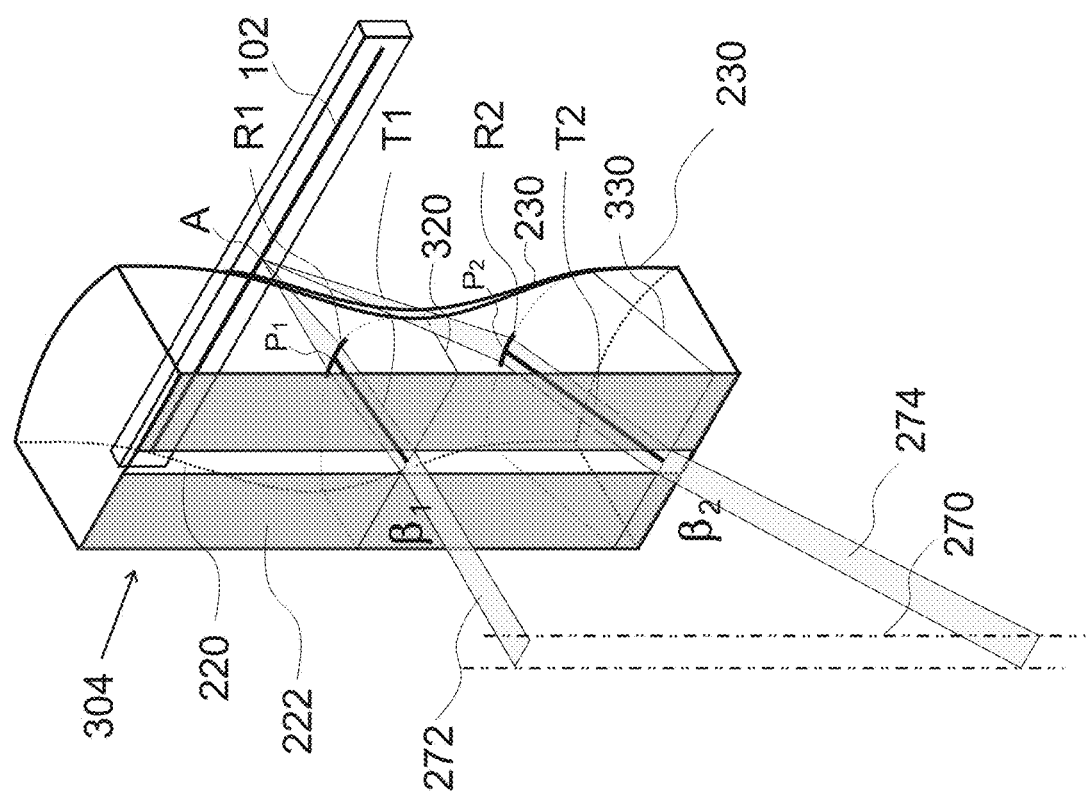
FIG. 5 is a schematic illustration of an alternative embodiment of a linear sensor with a freeform lens, constructed and operative in accordance with a preferred embodiment of the present invention.

Reference is now made to FIG. 5, which illustrates a sensing module 300 comprising high speed linear sensor 102 and a single, free form optical element or lens 304 that is generally optimized to produce a largely distortion free and relatively sharply focused mapping of vertical features over large fields of view onto the individual pixels of linear sensor 102. As in the previous embodiments, optical element 304 may be positioned in front of horizontal linear sensor 102.

Lens 304 may comprise a relatively flat outward surface 222 and an aspheric optical inward surface 230, designed to face linear sensor 102. Inward surface 230 may have a positive radius of curvature along a horizontal axis at a central point $P_2$ and a negative radius of curvature along a vertical axis at point $P_1$ designed to be placed opposite linear sensor 102. Outward surface 222 may be partially covered to create a largely rectangular vertical slit 220, which may form an optical aperture.

As can be seen, light may pass through slit 220 and into lens 304 until it reaches inward surface 230, which may focus the light sharply onto linear sensor 102.

It will be appreciated that the optical power may be decreased when moving out from the center of the lens while the thickness may be increased to adjust the focus while maintaining a constant magnification. As shown in FIG. 5, a ray 272 of light incident on lens 330 from a central vertical line 270 and reaching sensor 102 from a direction normal to slit 220, at an angle β1, may pass through a small thickness (T1) and a small radius of curvature (R1) of lens 330 to be sharply focused on sensor 102. On the other hand, a ray 274 of light incident on slit 220 and reaching sensor at a larger incident angle, labeled β2, will encounter a cross section of lens 330 with a greater lens thickness (T2) and a larger radius of curvature (R2) to also be sharply focused on the same pixel A of sensor 102. It will be appreciated that the parameters R and T may be adjusted so that light exiting the lens 330 at point $P_2$, which is at a greater distance from the sensor than point $P_1$, is also brought into sharp focus at point A.

Thus, the optical power of aspheric optical surface 230 may be set at each point so that the magnification of the azimuthal angle α may remain constant irrespective of the collection angle β (i.e. a point along slit 220) of incidence.

Figure 6A:
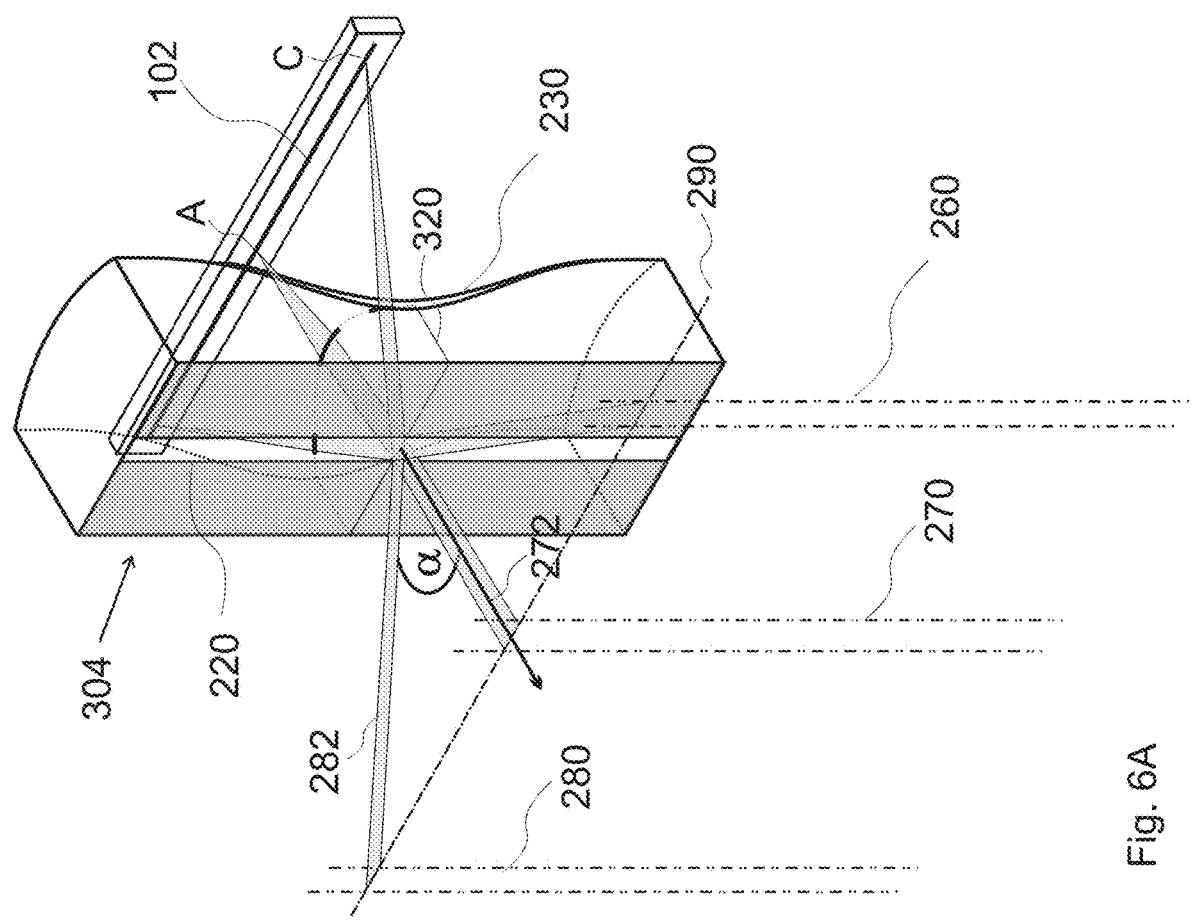
FIGS. 6A and 6B are schematic illustrations showing how light impinging on the freeform lens of FIG. 5 is focused onto the linear sensor.

Reference is now made to FIG. 6A, which illustrates light incident on sensor 102 from 2 different azimuth angles α (from central vertical line 270 and from a non-central vertical line 280). Note that light ray 272 impinges on point A of sensor 102. However, like the embodiments of FIGS. 3 and 4, light ray 282 from non-central vertical line 280 impinges on point C of sensor 102.

Figure 6B:
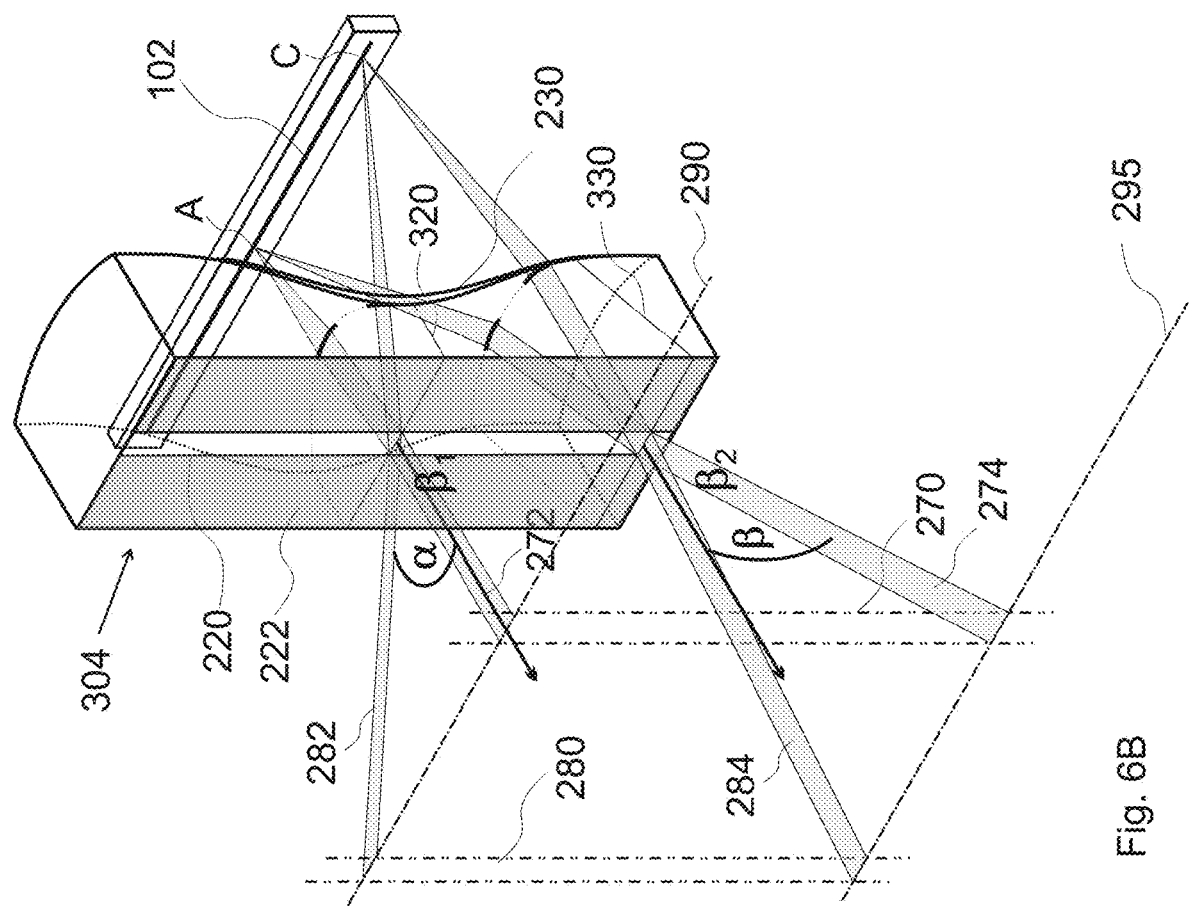

Reference is now made to FIG. 6B, which shows superposition of light incident on sensor 102 at 2 different azimuth angles α (from vertical lines 270 and 280 and at 2 different points β (β1 and β2) along slit 220. Note that features located along a constant horizontal azimuthal angle α, such as features from light rays 282 and 284 and those from light rays 272 and 274, may map to the same pixel (C and A, respectively), regardless of the collection angle (3, of linear sensor 102.

An example of an aspheric surface Z(x,y) meeting the above requirements may be given by the following equation:

$$Z(x,y)=a(y)X^2+b(y) \qquad \text{Equation 1}$$

Where:
P=abs(y);
a(y)=0.001*(−8.736P³+47.52P²+0.254P−347.2);
b(y)=0.001*(−18.27P³+94.21P²−19.56P+2263);
−1.76<X<1.76; and
P<3.5.

Such a freeform lens may readily be fabricated by single point diamond turning or by injection molding.

ADDITIONAL EMBODIMENTS

It is appreciated that any of the optical elements described hereinabove may be used for linear imaging in conjunction with a 2D sensor, such as when the sensor is operated in a rolling shutter or windowing mode.

Moreover, a measurement unit may have multiple types of optical elements together in a single unit. This may provide a measurement unit with both rotation invariance as well as distortion-free mapping.

While certain features of the different embodiments of the present invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A sensing module comprising:
a linear image sensor; and
an optical unit comprising:
an optical element having a curved, outward surface; and
a covering on said curved surface of said optical element, said covering having a slit formed therein, said optical unit facing said sensor with said slit perpendicular to a longitudinal axis of said linear sensor and to image a wide field of view onto a single pixel of said linear sensor, wherein light impinging normal to said slit, at any location along said slit, is imaged on a central pixel of said linear sensor while light impinging one of a plurality of non-normal angles to said slit at any location along said slit, is imaged on an associated one of a plurality of non-central pixels of said linear sensor, wherein an image produced by said optical unit is rotationally invariant around said longitudinal axis of said linear sensor.

2. The sensing module of claim 1 and wherein said optical element is a single monolithic lens.

3. The sensing module of claim 1 and wherein said optical element is a domed lens and said covering covers the outer surface of said domed lens.

4. The sensing module of claim 1 and wherein said optical element is an aspheric toroidal lens mounted in an opaque dome and the covering is on the lens.

5. The sensing module of claim 4 and wherein said aspheric toroidal lens linearizes the pixel vs. angle of incidence response of the said optical module.

6. The sensing module of claim 3 and wherein said optical element is an oval-shaped dome.

* * * * *